(12) United States Patent
Lindgren

(10) Patent No.: US 7,113,050 B1
(45) Date of Patent: Sep. 26, 2006

(54) INTEGRATED CIRCUIT WITH OSCILLATOR AND ELECTROSTATIC DISCHARGE PROTECTION

(75) Inventor: Eric Lindgren, Bonney Lake, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 39 days.

(21) Appl. No.: 10/956,688

(22) Filed: Oct. 1, 2004

(51) Int. Cl.
*H03B 5/12* (2006.01)
*H02H 7/20* (2006.01)

(52) U.S. Cl. .............. 331/117 FE; 331/62; 331/117 R; 331/167

(58) Field of Classification Search ............ 331/117 R, 331/117 FE, 167, 62
See application file for complete search history.

(56) References Cited

U.S. PATENT DOCUMENTS

| | | | |
|---|---|---|---|
| 6,323,735 B1 | 11/2001 | Welland et al. | |
| 6,680,655 B1* | 1/2004 | Rogers | 331/109 |
| 2002/0014907 A1* | 2/2002 | Blodgett et al. | 327/536 |
| 2002/0125931 A1* | 9/2002 | Yue et al. | 327/310 |
| 2003/0102923 A1* | 6/2003 | Vickram et al. | 330/298 |
| 2005/0253659 A1* | 11/2005 | Favrat et al. | 331/57 |

* cited by examiner

*Primary Examiner*—Robert Pascal
*Assistant Examiner*—James Goodley
(74) *Attorney, Agent, or Firm*—Vedder, Price, Kaufman & Kammholz

(57) ABSTRACT

An integrated circuit (IC) with an oscillator and electrostatic discharge (ESD) protection in which the parasitic capacitance of the ESD protection circuitry is disassociated from the oscillator circuitry to minimize loading of the tank circuit thereby minimizing degradation of the tank circuit quality factor (Q).

19 Claims, 2 Drawing Sheets

100

INTEGRATED CIRCUIT WITH OSCILLATOR AND ELECTROSTATIC DISCHARGE PROTECTION

BACKGROUND OF THE INVENTION

1. Field of the Invention

The present invention relates to an integrated circuit (IC) with an oscillator, and in particular, to such a circuit which also includes electrostatic discharge (ESD) protection.

2. Description of the Related Art

Referring to FIG. 1, high frequency oscillators play a critical role in many circuits, particularly wireless communication circuits. With the increased use and complexities of wireless communication devices, such circuits have become increasingly sophisticated. Among others, one characteristic which is often critical is low phase noise performance. This requires the oscillator to have a resonant, or "tank", circuit with a high quality factor Q.

Referring to FIG. 1, one conventional implementation of an oscillator 10 within an IC includes an amplifier circuit with cross-coupled complementary metal oxide semiconductor field effect transistors (C-MOSFETs), such as P-type transistors P1 and P2 and N-type transistors N1 and N2, interconnected substantially as shown, and biased between upper (e.g., positive) VDD and lower (e.g., negative) VSS/GND power supply voltage terminals via a resistor R1. The output voltage Vout is a differential voltage which appears between signal electrodes 12a and 12b. The tank circuit is formed using shunt capacitors C1 and C2 and inductors L1 and L2 connected to signal electrodes 12a and 12b as shown. As is well known in the art, the capacitors C1, C2 can be variable, e.g., varactors, so that this oscillator circuit 10 can be operated as a voltage control oscillator (VCO). The inductors are connected together via a shared electrode B3 (discussed in more detail below).

As is well known in the art, modern ICs virtually always include on-chip ESD protection, and this circuit 10 is no different. To prevent an external ESD event from damaging the oscillator circuitry, ESD protection circuitry in the form of shunt diodes D1a, D1b, D2a and D2b are connected between the output signal electrodes 12a, 12b (which can also be electrically connected to on-chip bonding pads B1, B2) and the power supply rails VDD, VSS/GND as shown. (The operating principles of such ESD protection circuitry are well known in the art. Further, it will be appreciated by one of ordinary skill in the art that other forms of ESD protection circuitry can be used as well, with such other forms of ESD circuitry also being connected in a shunt arrangement at the output signal electrodes 12a, 12b.)

Referring to FIG. 2 in conjunction with FIG. 1, the inductors L1, L2 are typically implemented using bond wires 14a, 14b, with the shared electrode B3 being a bonding pad resident on a package leadframe 22 upon which the die 20 containing the IC is placed. At the high frequencies for which such integrated oscillator circuits are used, such bond wires 14a, 14b provide the inductance necessary for the tank circuit. As is well known in the art, the die 20 will include a number of other bonding pads 24, which are electrically connected to package leadframe bonding pads 26 via bond wires 28.

A problem with this conventional approach, however, is the loading presented to the signal electrodes 12a, 12b by the shunt ESD circuitry. Such loading is generally in the form of the shunt capacitance which is inherent to the ESD protection circuitry. This shunt capacitance generally has a low quality factor Q, and thereby causes the overall quality factor Q of the tank circuit to be significantly degraded, resulting, in turn, in increased phase noise in the output signal Vout of the oscillator circuit. Further, such additional capacitance of the ESD circuitry adds to the fixed capacitance of the tank circuit, thereby limiting the maximum oscillation frequency and decreasing the effective tuning range, e.g., when using varactors for the tank circuit capacitors C1, C2.

SUMMARY OF THE INVENTION

In accordance with the presently claimed invention, an integrated circuit (IC) with an oscillator and electrostatic discharge (ESD) protection is provided in which the parasitic capacitance of the ESD protection circuitry is disassociated from the oscillator circuitry to minimize loading of the tank circuit thereby minimizing degradation of the tank circuit quality factor (Q).

In accordance with one embodiment of the presently claimed invention, an integrated circuit (IC) with an oscillator and electrostatic discharge (ESD) protection includes power supply electrodes, shared electrodes, amplifier circuitry, inductances, capacitances, ESD protection circuitry and a DC connection. The amplifier circuitry is coupled between first and second power supply electrodes and includes first and second signal electrodes. First and second inductances are coupled between a first shared electrode and the first and second signal electrodes, respectively. First and second capacitances are coupled between at least one of the first and second power supply electrodes and the first and second signal electrodes, respectively. The ESD protection circuitry is coupled between a second shared electrode and at least one of the first and second power supply electrodes. The DC connection is between the first and second shared electrodes.

In accordance with another embodiment of the presently claimed invention, an integrated circuit (IC) with an oscillator and electrostatic discharge (ESD) protection includes power supply electrodes, shared electrodes, amplifier circuitry, bond wires, capacitances and ESD protection circuitry. The amplifier circuitry is coupled between first and second power supply electrodes and includes first and second signal electrodes. First and second bond wires are coupled between a first shared electrode and the first and second signal electrodes, respectively. First and second capacitances are coupled between at least one of the first and second power supply electrodes and the first and second signal electrodes, respectively. The ESD protection circuitry is coupled between a second shared electrode and at least one of the first and second power supply electrodes. A third bond wire is coupled between the first and second shared electrodes.

In accordance with still another embodiment of the presently claimed invention, an integrated circuit (IC) with an oscillator and electrostatic discharge (ESD) protection includes power supply electrodes, shared electrodes, oscillator circuitry, ESD protection circuitry and a DC connection. The oscillator circuitry is coupled between first and second power supply electrodes and includes tank circuitry and first and second signal electrodes. The tank circuitry includes inductance circuitry coupled between a first shared electrode and the first and second signal electrodes, and capacitance circuitry coupled between at least one of the first and second power supply electrodes and the first and second signal electrodes. The ESD protection circuitry is coupled between a second shared electrode and at least one of the first and second power supply electrodes. The DC connection is between the first and second shared electrodes.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
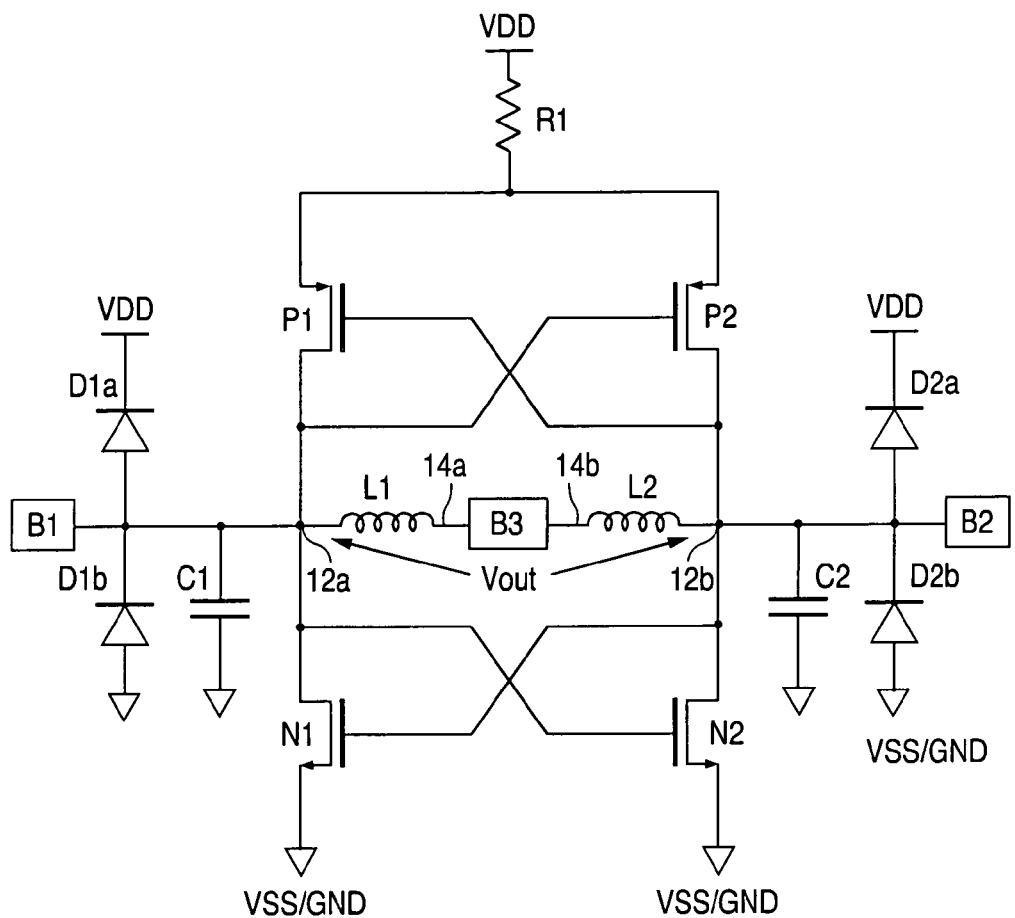
FIG. 1 is a schematic diagram of a conventional integrated oscillator circuit with ESD protection.
Figure 3:
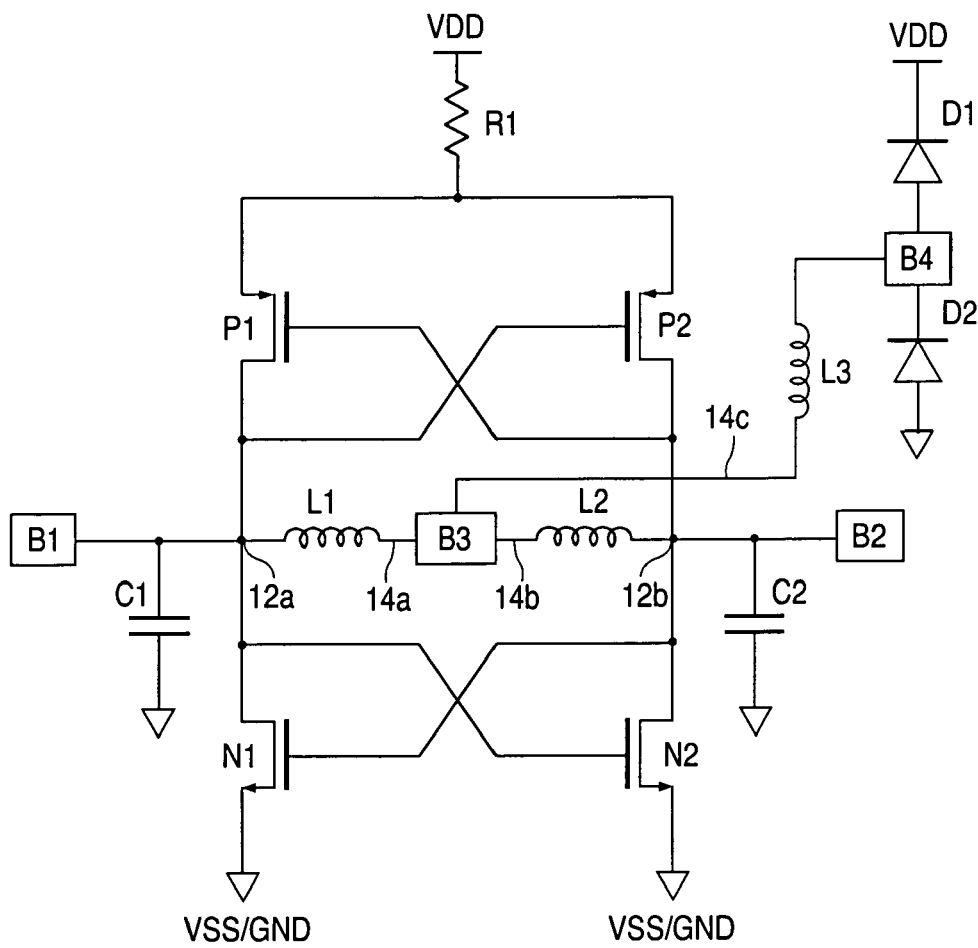
FIG. 3 is a schematic diagram of an integrated oscillator circuit with ESD protection in accordance with one embodiment of the presently claimed invention.

Referring to FIG. 3, an IC with an oscillator and ESD protection 100 in accordance with one embodiment of the presently claimed invention includes the amplifier circuit components P1, P2, N1, N2 and tank circuit components L1, L2, C1, C2 interconnected as in the circuit of FIG. 1. However, in accordance with the presently claimed invention, the ESD protection circuitry is no longer connected directly at the signal electrodes, 12a, 12b. Instead, the ESD protection circuitry (which can now be implemented in a simpler form, e.g., two shunt diodes D1, D2, connected between a single IC bonding pad B4 and the power supply rails VDD, ground) is connected to the package leadframe bonding pad B3 shared by the inductors L1, L2 via another inductance L3, e.g., another bond wire 14c.

Provided the bond wires 14a, 14b forming the tank inductances L1, L2 are substantially matched in length, the package leadframe bonding pad B3 will be at a signal ground potential due to the balanced nature of this differential oscillator circuitry 100. As a result, the capacitance of the shunt ESD protection circuit devices D1, D2 will also be at signal ground potential, and thereby not need to be charged or discharged along with the voltage oscillations of the tank circuit, and therefore will not draw any signal current from the tank circuit. Accordingly, since no signal current will flow through the lossy elements of the ESD protection circuit, there is no signal power loss. Consequently, the quality factor Q of the tank circuitry is not degraded by the ESD protection circuit devices. Even with some mismatch in the lengths of the bond wires 14a, 14b forming the tank circuit inductances L1, L2, any signal voltage variation at the package leadframe bonding pad B3 will still be significantly less than the signal voltage appearing at the signal electrodes 12a, 12b.

Figure 2:
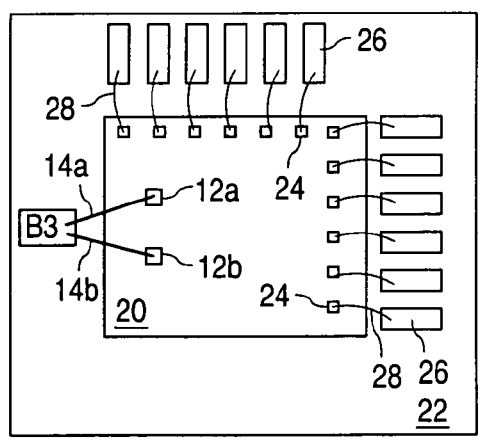
FIG. 2 is a simplified view of an integrated circuit package having a package leadframe inductor circuit bonding pad connected in a conventional manner.
Figure 4:
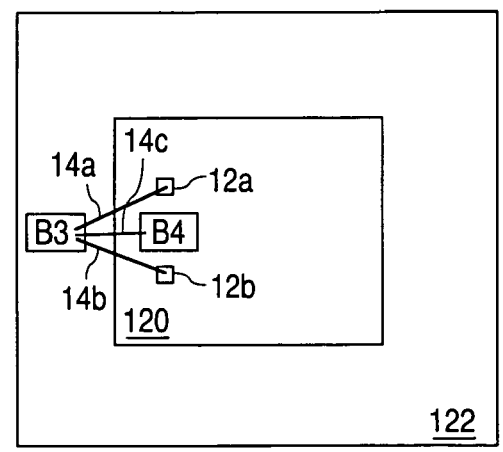
FIG. 4 is a simplified view of an integrated circuit package having a package leadframe inductor circuit bonding pad connected in accordance with one embodiment of the presently claimed invention.

Referring to FIG. 4, as noted above, the on-chip ESD protection circuitry is connected to the IC bonding pad B4 which, in turn, is connected to the package leadframe bonding pad B3 via a DC connection in the form of another bond wire 14c. (The other bonding pads and bond wires as depicted in the diagram of FIG. 2 have been omitted for purposes of clarity.)

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated circuit (IC) with an oscillator and electrostatic discharge (ESD) protection, comprising:
   first and second power supply electrodes;
   first and second shared electrodes;
   amplifier circuitry coupled between said first and second power supply electrodes and including first and second signal electrodes;
   first and second inductances coupled between said first shared electrode and said first and second signal electrodes, respectively;
   first and second capacitances coupled between at least one of said first and second power supply electrodes and said first and second signal electrodes, respectively;
   ESD protection circuitry coupled between said second shared electrode and
   a DC exclusive of said first and second inductances connection between said first and second shared electrodes.

2. The apparatus of claim 1, wherein said amplifier circuitry comprises a cross-coupled amplifier circuit.

3. The apparatus of claim 1, wherein:
   said first shared electrode comprises a package leadframe bonding pad; and
   said first and second signal electrodes comprise first and second IC bonding pads.

4. The apparatus of claim 1, wherein said first and second inductances comprise first and second bond wires, respectively.

5. The apparatus of claim 1, wherein said ESD protection circuitry comprises at least one diode coupled between said second shared electrode and at least one of said first and second power supply electrodes.

6. The apparatus of claim 1, wherein said DC connection comprises a bond wire.

7. The apparatus of claim 1, wherein said first shared electrode has an AC voltage potential substantially equal to that of one of said first and second power supply electrodes.

8. An apparatus including an integrated circuit (IC) with an oscillator and electrostatic discharge (ESD) protection, comprising:
- first and second power supply electrodes;
- first and second shared electrodes;
- amplifier circuitry coupled between said first and second power supply electrodes and including first and second signal electrodes;
- first and second bond wires coupled between said first shared electrode and said first and second signal electrodes, respectively;
- first and second capacitances coupled between at least one of said first and second power supply electrodes and said first and second signal electrodes, respectively;
- ESD protection circuitry coupled between said second shared electrode and at least one of said first and second power supply electrodes; and
- a third bond wire coupled between said first and second shared electrodes.

9. The apparatus of claim 8, wherein said amplifier circuitry comprises a cross-coupled amplifier circuit.

10. The apparatus of claim 8, wherein:
- said first shared electrode comprises a package leadframe bonding pad; and
- said first and second signal electrodes comprise first and second IC bonding pads.

11. The apparatus of claim 8, wherein said ESD protection circuitry comprises at least one diode coupled between said second shared electrode and at least one of said first and second power supply electrodes.

12. The apparatus of claim 8, wherein said first shared electrode has an AC voltage potential substantially equal to that of one of said first and second power supply electrodes.

13. An apparatus including an integrated circuit (IC) with an oscillator and electrostatic discharge (ESD) protection, comprising:
- first and second power supply electrodes;
- first and second shared electrodes;
- oscillator circuitry coupled between said first and second power supply electrodes and including tank circuitry and first and second signal electrodes, wherein said tank circuitry comprises
  - inductance circuitry coupled between said first shared electrode and said first and second signal electrodes, and
  - capacitance circuitry coupled between at least one of said first and second power supply electrodes and said first and second signal electrodes;
- ESD protection circuitry coupled between said second shared electrode and at least one of said first and second power supply electrodes; and
- a DC connection exclusive of said inductance circuitry between said first and second shared electrodes.

14. The apparatus of claim 13, wherein said oscillator circuitry comprises a cross-coupled amplifier circuit.

15. The apparatus of claim 13, wherein:
- said first shared electrode comprises a package leadframe bonding pad; and
- said first and second signal electrodes comprise first and second IC bonding pads.

16. The apparatus of claim 13, wherein said inductance circuitry comprises a plurality of bond wires.

17. The apparatus of claim 13, wherein said ESD protection circuitry comprises at least one diode coupled between said second shared electrode and at least one of said first and second power supply electrodes.

18. The apparatus of claim 13, wherein said DC connection comprises a bond wire.

19. The apparatus of claim 13, wherein said first shared electrode has an AC voltage potential substantially equal to that of one of said first and second power supply electrodes.

* * * * *

UNITED STATES PATENT AND TRADEMARK OFFICE
CERTIFICATE OF CORRECTION

| | |
|---|---|
| PATENT NO. | : 7,113,050 B1 |
| APPLICATION NO. | : 10/956688 |
| DATED | : September 26, 2006 |
| INVENTOR(S) | : Eric Lindgren |

Page 1 of 1

It is certified that error appears in the above-identified patent and that said Letters Patent is hereby corrected as shown below:

Column 4:
Line 44, after "and" insert --at least one of said first and second power supply electrodes; and--
Line 45, after "DC" insert --connection,-- and after "inductances" insert -- , --
Line 46, delete "connection".

Signed and Sealed this

Nineteenth Day of December, 2006

JON W. DUDAS
*Director of the United States Patent and Trademark Office*